(12) United States Patent
Han et al.

(10) Patent No.: US 6,495,414 B2
(45) Date of Patent: Dec. 17, 2002

(54) METHOD FOR MANUFACTURING CAPACITOR IN SEMICONDUCTOR DEVICE

(75) Inventors: Seung Kyu Han, Seoul (KR); Dong Su Park, Kyoungki-do (KR)

(73) Assignee: Hynix Semiconductor, Inc., Kyoungki-do (KR)

(*) Notice: Subject to any disclaimer, the term of this patent is extended or adjusted under 35 U.S.C. 154(b) by 0 days.

(21) Appl. No.: 09/867,659

(22) Filed: May 31, 2001

(65) Prior Publication Data
US 2002/0016037 A1 Feb. 7, 2002

(30) Foreign Application Priority Data
Jun. 1, 2000 (KR) .............................. 00-30085

(51) Int. Cl.[7] .......................................... H01L 21/8242
(52) U.S. Cl. ........................ 438/250; 438/785; 438/240
(58) Field of Search ................... 438/785–788, 438/778, 240, 253, 255, 398, 482; 257/315

(56) References Cited

U.S. PATENT DOCUMENTS 6,180,542 B1 * 1/2001 Hwang ...................... 438/785
6,201,276 B1 * 3/2001 Agarwal et al. ............. 257/315
6,338,995 B1 * 1/2002 Hwang ...................... 438/240

* cited by examiner

Primary Examiner—David Nelms
Assistant Examiner—Dung Anh Le
(74) Attorney, Agent, or Firm—Finnegan, Henderson, Farabow, Garrett & Dunner, L.L.P.

(57) ABSTRACT

The present invention discloses a method for manufacturing a capacitor of a semiconductor memory device.

The disclosed present invention comprises steps of forming a lower electrode made of a conductive polysilicon film or a conductive amorphous silicon film on a semiconductor substrate; forming a nitride film over the lower electrode; depositing an amorphous TaON thin film over the nitride film; subjecting the amorphous TaON thin film to a thermal treatment to effect a crystallization thereof; and forming a laminated structure composed of a TiON film and a doped silicon film for an upper electrode on the crystallized TaON thin film.

16 Claims, 3 Drawing Sheets

METHOD FOR MANUFACTURING CAPACITOR IN SEMICONDUCTOR DEVICE

CROSS-REFERENCE TO RELATED APPLICATIONS

This application claims priority from Korean Patent Application No. 2000-30085, filed Jun. 1, 2000, the entirety of which is incorporated herein by reference.

BACKGROUND OF THE INVENTION

1. Field of the Invention

The invention relates to a method for manufacturing a capacitor in a semiconductor device, and more particularly a method for manufacturing a capacitor in a semiconductor device in which a depletion of oxygen and a leakage current in a dielectric film can be suppressed.

2. Description of the Related Art

Recently, the need for memory elements had increased along with the development of techniques for manufacturing semiconductor devices. In a semiconductor device, a capacitor is used as means for storing data. The electric capacitance of such a capacitor depends on the electrode area and the dielectric constant of a dielectric film interposed between electrodes.

However, as semiconductor devices are highly integrated, the capacitor area given in the semiconductor device is reduced. Accordingly, the electrode area of the capacitor is decreased, thereby causing a reduction in the electric capacitance of the capacitor.

In order to solve this problem, a capacitor comprising a TaON thin film of high dielectric constant has been proposed, in which the TaON film has a metal film-insulating film-silicon (MIS) structure. As an upper electrode over the TaON thin film, a laminated structure of a TiN film/a polysilicon film is used.

FIG. 1 is a cross-sectional view illustrating a conventional method for manufacturing a capacitor with a TaON thin film in a semiconductor device.

As shown in FIG. 1, according to the conventional capacitor manufacturing method, a TaON thin film 2 having a high dielectric constant is deposited over a lower electrode 1, for example, a polysilicon film.

Then, a TiN/polysilicon film 3 having a laminated structure is deposited over the TaON thin film 2. The deposition of the TiN/polysilicon film 3 is achieved by forming a TiN thin film in a CVD (Chemical Vapor Deposition) chamber using $TiCl_4$ as a precursor and $NH_3$ as a reaction gas. Thus, a capacitor with an MIS structure is completely formed.

However, there are some problems involved in the conventional method for manufacturing a capacitor of a semiconductor memory device.

For example, when forming the TiN thin film in the CVD chamber using $TiCl_4$ as a precursor and $NH_3$ as a reaction gas during the formation process of the TiN/polysilicon film having a laminated structure conducted after the deposition of the TaON thin film having a high dielectric constant, oxidation may occur between the TiN thin film and the TaON thin film at a CVD chamber temperature around 500° C. As a result, oxygen in the TaON thin film migrates to the TiN thin film, whereby a depletion of oxygen occurs within the TaON thin film. Also, there is an increase in leakage current in the capacitor comprised of the TaON thin film.

SUMMARY OF THE INVENTION

Therefore, the present invention has been made in order to solve the above-mentioned problems in the related art.

The present invention provides a method for manufacturing a capacitor in a semiconductor device, which is capable of preventing deterioration of the dielectric film while suppressing the generation of leakage current in the capacitor.

In accordance with one aspect, the present invention provides a method for manufacturing a capacitor in a semiconductor device, comprising steps of: forming a lower electrode on a semiconductor substrate; forming a nitride film over the lower electrode; forming an amorphous TaON thin film over the nitride film; subjecting the amorphous TaON thin film to a thermal treatment at a high temperature to effect a crystallization thereof; and forming a laminated structure composed of a TiON film and a doped silicon film for an upper electrode over the crystallized TaON thin film.

In accordance with another aspect, the present invention provides a method for manufacturing a capacitor in a semiconductor device, comprising steps of: forming a lower electrode made of a conductive polysilicon film or a conductive amorphous silicon film on a semiconductor substrate; forming a nitride film over the lower electrode; forming an amorphous TaON thin film over the nitride film; crystallizing the TaON thin film by using a furnace in a batch type furnace (batch furnace) or a rapid thermal treatment; and forming a laminated structure composed of a TiON film and a doped silicon film for an upper electrode over the crystallized TaON thin film.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, a preferred embodiment according to the present invention will be described in detail, with reference to the annexed drawings.

FIGS. 2A, 2B, 2C, 2D, 2E and 2F are cross-sectional views respectively illustrating the sequential processing steps of a method for manufacturing a capacitor in a semiconductor device according to the present invention.

Figure 1:
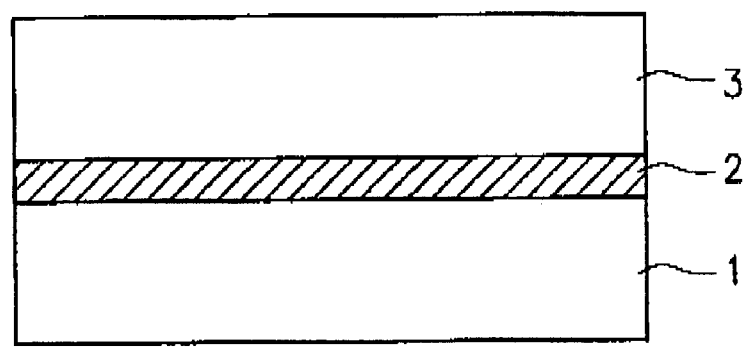
FIG. 1 is a cross-sectional view illustrating the method for manufacturing a capacitor in a semiconductor device in the prior art.
Figure 2A:
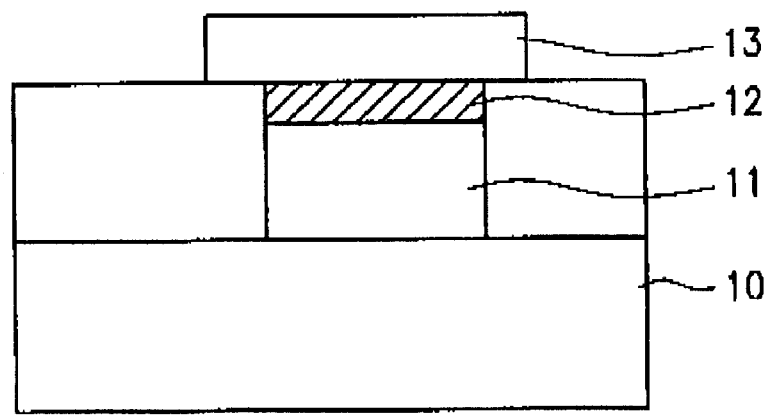
FIGS. 2A, 2B, 2C, 2D, 2E and 2F are cross-sectional views respectively illustrating sequential processing steps of a method for manufacturing a capacitor in a semiconductor device according to the present invention.

According to the present invention, as shown in FIG. 2A, a lower electrode 13 is first formed on a semiconductor substrate 10 having a structure in which a plug polysilicon film 11 and a barrier metal film 12 are sequentially laminated within a contact hole (not shown) formed at an interlayer insulating film by a known method. The lower electrode 13 may be formed to have a cylindrical structure or a stacked structure. The lower electrode 13 is made of a polysilicon film or an amorphous silicon film using meta poly silicon (MPS).

Figure 2B:
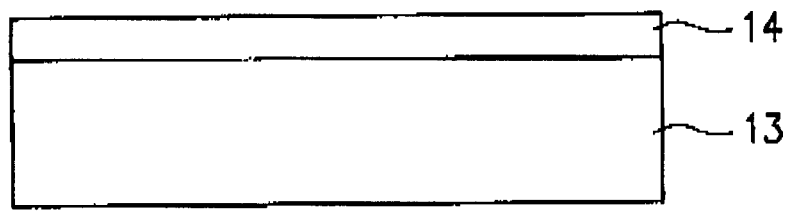

As shown in FIG. 2B, which shows an enlarged view of the lower electrode 13, a nitride thin film 14 is formed over the lower electrode 13. The formation process of the nitride film 14 over the lower electrode 13 is carried out by forming a nitride film over a surface of the lower electrode 13 in a CVD chamber at a temperature of 300° C. to 450° C. for 1 to 10 minutes using plasma while supplying $NH_3$ gas in an amount of about 50 to 150 standard cubic centimeters per minute (sccm). The nitride film 14 prevents a low dielectric layer, that is, a $SiO_2$ layer, from being formed between the lower electrode 13 and a TaON thin film (not shown) which is a dielectric layer to be formed in a subsequent thermal treatment process.

Figure 2C:
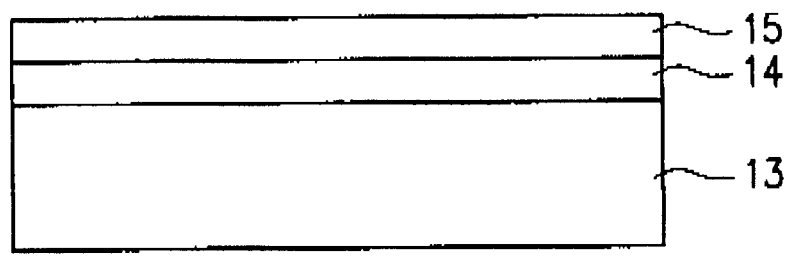

As shown in FIG. 2C, an amorphous TaON thin film 15 having a high dielectric constant is formed over the nitride film 14. The formation process of the TaON thin film 15 is carried out by depositing an amorphous TaON thin film 15 in an in-situ fashion in a CVD chamber. More particularly, the TaON film is formed by evaporating a predetermined amount of tantalum ethylate $(Ta(OC_2H_5)_5)$ as a raw material in a vaporizer, kept at 160° C. to 190° C., thereby producing Ta chemical vapor, and supplying the Ta chemical vapor to the CVD chamber, to which $O_2$ gas is supplied at a flow rate of 25 to 200 sccm, while maintaining the CVD chamber at a pressure of 0.2 to 0.4 torr and a temperature of 350° C. to 450° C., thereby generating a surface chemical reaction of the supplied $O_2$ gas and the Ta chemical vapor.

Figure 2D:
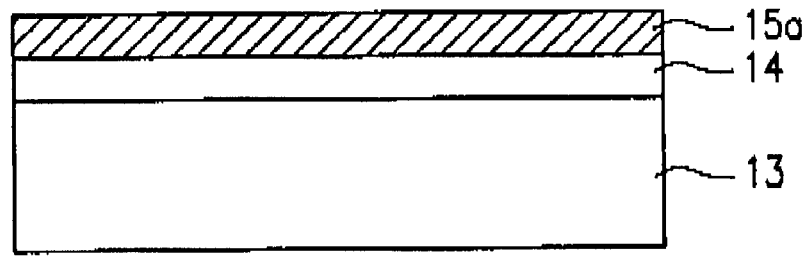

Subsequently, as shown in FIG. 2D, the amorphous TaON thin film 15 is crystallized in order to strengthen the bonding force thereof and to reduce the generation of leakage current. In addition, as the amorphous TaON thin film 15 is slightly contracted by the crystallization, its dielectric constant can be increased.

The above crystallization process of the TaON thin film 15 is carried out by subjecting it to a thermal treatment for about 1 minutes to 1 hour at a temperature of 750° C. to 900° C. in a CVD chamber where $O_3$ gas is supplied at a flow rate of about 10 to 1,000 sccm. Thus, a crystallized TaON thin film 15a is formed.

Also, the crystallized TaON thin film 15a can be produced using a batch type furnace (batch furnace) or a rapid thermal process at a temperature of 750° C. to 900° C. under an atmosphere of $N_2O$ or $O_3$ for about 30 seconds to 1 hour.

Figure 2E:
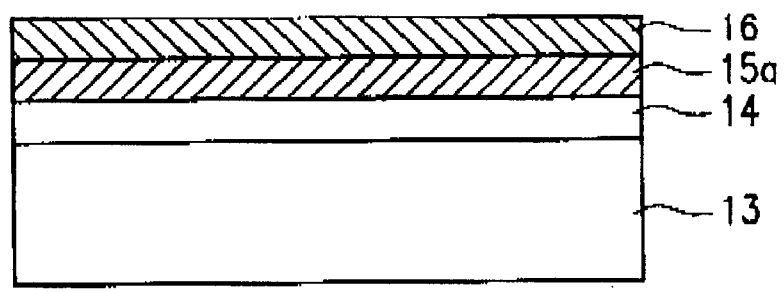

Then, as shown in FIG. 2E, a TiON thin film 16, which is a metal film for an upper electrode, is formed over the crystallized TaON thin film 15a. The TiON thin film 16 is formed in an in-situ fashion in the CVD chamber where $O_3$ gas has been supplied in the previous crystallization process of the TaON thin film.

Further, the formation process of the TiON thin film 16 can be carried out by supplying a desired amount of $TiCl_4$ as a precursor to a vaporizer via a flow regulator and evaporating the precursor at a temperature of 150° C. to 200° C., thereby producing TiN chemical vapor. Along with the TiN chemical vapor, $NH_3$ gas is supplied at a flow rate of about 10 to 1,000 sccm to the chamber, where $O_3$ gas has been already supplied, so that a surface chemical reaction occurs at a temperature of 300° C. to 600° C. By this surface chemical reaction, the TION thin film 16 is formed.

Figure 2F:
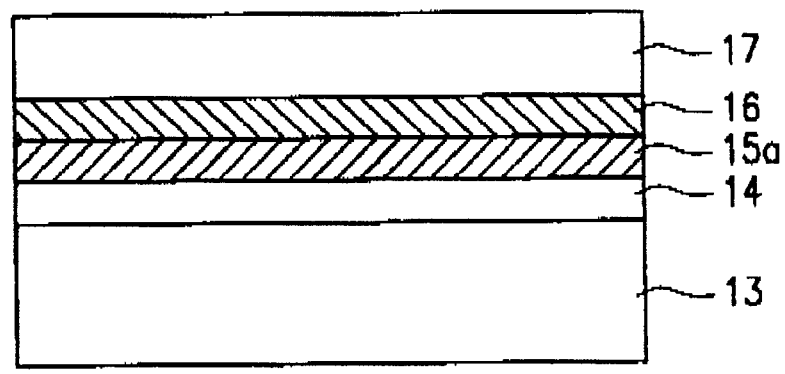

Finally, as shown in FIG. 2F, a doped polysilicon film 17 is deposited over the TiON thin film 16 to form an upper electrode composed of the TiON thin film 16 and the doped polysilicon film 17. As such, a capacitor in a semiconductor device is completely formed.

As described above, the method for manufacturing a capacitor of a semiconductor device according to the present invention has effects as follows.

In accordance with the present invention, the amorphous TaON thin film is crystallized to strengthen the bonding force of the TaON thin film and to reduce the generation of leakage current. It is also possible to achieve an increase in dielectric constant by virtue of a contraction of the TaON thin film resulting from the crystallization.

Also, since the TION thin film as an upper electrode is formed using $O_3$ gas which has a good reactivity, it is possible to prevent the formation of a $TiO_2$ layer resulting from an oxidation reaction of the TaON thin film and the TiN film conventionally used as an upper electrode and to suppress the generation of leakage current and a deterioration in the characteristics of the TaON thin film capacitor due to a depletion of $O_2$ in the TaON thin film.

In addition, as the high-temperature treatment for the amorphous TaON thin film is carried out in a CVD chamber, and the TION thin film is formed in an in-situ fashion, it is possible to simplify the process, and thereby to save costs. Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A method of manufacturing a capacitor in a semiconductor device comprising:

forming a lower electrode on a semiconductor substrate;

forming a nitride film on the lower electrode;

forming an amorphous TaON thin film on the nitride film;

crystallizing the amorphous TaON thin film in a thermal treatment to yield a crystalline TaON thin film; and forming an upper electrode on the crystalline TaON thin film, said upper electrode comprising a laminated structure comprising a TiON film and a doped silicon film.

2. The method according to claim 1, wherein the lower electrode comprises at least one of a cylindrical structure and a stacked structure.

3. The method according to claim 1, wherein forming the nitride film comprises forming the nitride film on a surface of the lower electrode, in a CVD chamber, at a temperature ranging from 300° C. to 450° C., for a time ranging from 1 to 10 minutes, using a plasma, and while supplying $NH_3$ gas at a rate ranging from 50 to 150 sccm.

4. The method according to claim 1, wherein forming the amorphous TaON thin film comprises generating an in-situ surface chemical reaction of supplied $O_2$ gas and vapor comprising Ta on said nitride film, said generating comprising:

forming the vapor comprising Ta, said forming comprising evaporating a raw material comprising a predetermined amount of tantalum ethylate $(Ta(OC_2H_5)_5)$ in a vaporizer, wherein said vaporizer is held at a temperature ranging from 160° C. to 190° C.;

supplying the vapor comprising Ta to a CVD chamber;

supplying the $O_2$ gas to said CVD chamber at a flow rate ranging from 25 to 200 sccm; and maintaining the CVD chamber at a pressure ranging from 0.2 to 0.4 torr and a temperature ranging from 350° C. to 450° C.

5. The method according to claim 1, wherein the crystallizing comprises subjecting the amorphous TaON thin film to thermal treatment at a temperature ranging from 750° C. to 900° C. for a time ranging from 1 minute to 1 hour in a CVD chamber, wherein $O_3$ gas is supplied to said CVD chamber at a flow rate ranging from 10 to 1,000 sccm.

6. The method according to claim 1, wherein the thermal treatment comprises using one of a batch furnace and a rapid thermal process at a temperature ranging from 750° C. to 900° C. under an atmosphere comprising at least one of $N_2O$ and $O_3$ for a time ranging from 30 seconds to 1 hour.

7. The method according to claim 1, wherein said laminated structure comprises a TiON thin film and a doped polysilicon film and is formed on the crystalline TaON thin film, wherein said TiON thin film is formed in-situ in a CVD chamber comprising $O_3$ gas supplied during said crystallizing.

8. The method according to claim 1, wherein forming the TiON thin film comprises supplying a predetermined amount of a precursor comprising $TiCl_4$ to a vaporizer; evaporating the precursor at a temperature ranging from 150° C. to 200° C. to produce a vapor comprising TiN; supplying the vapor comprising TiN and $NH_3$ gas at a flow rate ranging from 10 to 1,000 sccm to a CVD chamber comprising $O_3$ gas; and a surface chemical reaction at a temperature ranging from 300° C. to 600° C.

9. A method of manufacturing a capacitor in a semiconductor device comprising:
forming a lower electrode on a semiconductor substrate, said lower electrode comprising at least one of a conductive polysilicon film and a conductive amorphous silicon film;
forming a nitride film on the lower electrode;
forming an amorphous TaON thin film on the nitride film;
crystallizing the amorphous TaON thin film using at least one of a batch furnace and a rapid thermal treatment to yield a crystalline TaON thin film; and
forming an upper electrode on said crystalline TaON film, said upper electrode comprising a laminated structure comprising a TiON film and a doped silicon film.

10. The method according to claim 9, wherein the lower electrode comprises at least one of a cylindrical structure and a stacked structure.

11. The method according to claim 9, wherein forming the nitride film comprises forming the nitride film on a surface of the lower electrode, in a CVD chamber, at a temperature ranging from 300° C. to 450° C., for a time ranging from 1 to 10 minutes, using a plasma, and while supplying $NH_3$ gas at a rate ranging from 50 to 150 sccm.

12. The method according to claim 9, wherein forming the amorphous TaON thin film comprises generating an in-situ surface chemical reaction of supplied $O_2$ gas and vapor comprising Ta on said nitride film, said generating comprising:
forming a vapor comprising Ta, said forming comprising evaporating a raw material comprising a predetermined amount of tantalum ethylate $(Ta(OC_2H_5)_5)$ in a vaporizer, wherein said vaporizer is held at a temperature ranging from 160° C. to 190° C.;
supplying the vapor comprising Ta to a CVD chamber;
supplying $O_2$ gas to the CVD chamber at a flow rate ranging from of 25 to 200 sccm; and
maintaining the CVD chamber at a pressure ranging from 0.2 to 0.4 torr and a temperature ranging from 350° C. to 450° C.

13. The method according to claim 9, wherein crystallizing the amorphous TaON thin film comprises subjecting the amorphous TaON thin film to a thermal treatment for a time ranging from 1 minute to 1 hour at a temperature ranging from 750° C. to 900° C. in a CVD chamber where $O_3$ gas is supplied at a flow rate ranging from 10 to 1,000 sccm.

14. The method according to claim 9, wherein crystallizing the amorphous TaON thin film comprises subjecting the amorphous TaON thin film to a thermal treatment at a temperature of 750° C. to 900° C., under an atmosphere comprising at least one of $N_2O$ and $O_3$, and for a time ranging from 30 seconds to 1 hour.

15. The method according to claim 9, wherein said laminated structure comprises a TiON film and a doped polysilicon film, and wherein said TION film is formed in-situ in a CVD chamber comprising $O_3$ gas supplied during said crystallizing.

16. The method according to claim 9, wherein the TiON thin film is formed by a surface chemical reaction at a temperature of 300° C. to 600° C., said forming comprising supplying a precursor comprising a predetermined amount of $TiCl_4$ to a vaporizer via a flow regulator; evaporating the precursor at a temperature ranging from 150° C. to 200° C.; producing vapor comprising TiN; and supplying the vapor comprising TiN and $NH_3$ gas at a flow rate ranging from 10 to 1,000 sccm to the CVD chamber comprising $O_3$.

* * * * *